US007965125B2

(12) United States Patent
Ishida

(10) Patent No.: US 7,965,125 B2
(45) Date of Patent: Jun. 21, 2011

(54) CURRENT DRIVE CIRCUIT

(75) Inventor: Manabu Ishida, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/716,272

(22) Filed: Mar. 3, 2010

(65) Prior Publication Data

US 2010/0244906 A1 Sep. 30, 2010

(30) Foreign Application Priority Data

Mar. 24, 2009 (JP) ................................ 2009-072564

(51) Int. Cl.
*H03K 17/56* (2006.01)

(52) U.S. Cl. ........... 327/419; 327/427; 327/542; 326/82

(58) Field of Classification Search .................. 327/108, 327/109, 419, 421, 427–429, 538, 542–543; 326/31, 33, 34, 82, 83
See application file for complete search history.

(56) References Cited

U.S. PATENT DOCUMENTS

| | | | | |
|---|---|---|---|---|
| 5,406,130 | A * | 4/1995 | Hennig | 327/108 |
| 5,844,434 | A * | 12/1998 | Eschauzier | 327/143 |
| 5,939,921 | A * | 8/1999 | Strauss et al. | 327/322 |
| 5,990,711 | A | 11/1999 | Sekimoto | |
| 6,873,201 | B2 * | 3/2005 | Panhofer | 327/427 |
| 7,443,391 | B2 | 10/2008 | Yoneyama | |
| 2002/0043991 | A1 | 4/2002 | Nishitoba | |
| 2007/0159418 | A1 | 7/2007 | Mizuki | |
| 2007/0279104 | A1 | 12/2007 | Satoh | |

FOREIGN PATENT DOCUMENTS

| | | |
|---|---|---|
| JP | 1996-115136 | 5/1996 |
| JP | 2000-114891 | 4/2000 |

* cited by examiner

*Primary Examiner* — An T Luu
(74) *Attorney, Agent, or Firm* — Charles Bergere

(57) ABSTRACT

A current drive circuit allows for a reduction in chip size and prevents an output current from decreasing. The current drive circuit has an output terminal connected to a first resistor. The first resistor is connected to a second resistor and the drain of a first transistor. The gate of the first transistor is connected to the gate of a second transistor, a grounded first current source, and the source of a third transistor. A second current source and the third transistor are connected to a power supply line. The second current source is connected to the gate of the third transistor, the drain of a fourth transistor, the drain of a fifth transistor, and a second resistor. When the voltage decreases, the on resistance of the fourth transistor increases, the fifth transistor is then connected in series to the second transistor, which increases the gate voltage of the first transistor.

14 Claims, 3 Drawing Sheets

CURRENT DRIVE CIRCUIT

BACKGROUND OF THE INVENTION

The present invention relates to a current source circuit for use in a semiconductor integrated circuit.

An LED uses an open drain type current drive circuit. Japanese Laid-Open Patent Publication No. 08-115136 (page 1, FIG. 1) discusses increasing the saturation region of the current drive circuit to increase the output voltage. In this publication, first and second field-effect transistors (FETs), which have the same polarity, are connected in series. The gates of the two FETs are connected to each other. The source of the second FET is connected to a power supply, and the source of the first FET is connected to the drain of the second FET. The drain of the first FET functions as an output. In this case, the first FET operates in a saturation region, and the characteristics of each FET are determined so that the second FET operates at an operation point that is close to the saturation region, which is a linear region. A current control signal is applied to the gates of the two FETs.

Japanese Laid-Open Patent Publication No. 2000-114891 (page 1, FIG. 1) discusses the use of an operational amplifier to supply current within a wide output voltage range in a stable manner. In this publication, a constant current source and a first transistor are connected in series between first and second voltage sources. Second and third transistors are connected in series between a current output terminal and a second voltage source. An input terminal is connected to a node of the constant current source and the first transistor. A differential amplification circuit includes a non-inverting input terminal connected to a current source, an inverting input terminal connected to a node of the second and third transistors, and an output terminal connected to a control terminal of the third transistor. The control terminals of the first and second transistors are connected to each other, and a node of the control terminals is connected to a node of the constant current source and the first transistor.

Such open drain type circuits have the same problem. That is, when the drive circuit falls to a non-saturation region, the output voltage range may become narrow. However, when the circuit area is decreased, a resistor is used for protection from electrostatic discharge (ESD). In this case, the ESD resistor decreases the voltage, which results in the drive circuit entering the non-saturation region. Further, the output voltage may be increased to the saturation drain voltage. However, when the driver size is small due to limitations in the circuit area, a large gate voltage is necessary to output a large current.

When connecting transistors in series as in Japanese Laid-Open Patent Publication No. 08-115136, the drain terminal voltage cannot be decreased. In particular, a voltage margin is absorbed by the threshold voltage.

Further, Japanese Laid-Open Patent Publication No. 2000-114891 uses an operational amplifier. This increases power consumption. In addition, two transistors are connected in series and thus, the drain voltage cannot be decreased.

In the publications described above, the use of an ESD resistor is not taken into consideration. Further, it is considered that the output transistor is large and the gate voltage is small in the above-described publications.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

The present invention provides a current drive circuit that ensures the required current for a low output voltage when using a large resistor such as an ESD resistor.

One aspect of the present invention is a current drive circuit including an output terminal connected to a load, which is connected to a power supply voltage. An output transistor includes a drain terminal connected to the output terminal and a source terminal connected to a common potential line. A first transistor includes a gate terminal, which is connected to a gate terminal of the output transistor, and a drain terminal, which is connected to a first current source that supplies reference current. A second transistor includes a gate terminal, which is connected to the gate terminal of the output transistor, a drain terminal, which is connected to a source terminal of the first transistor, and a source terminal, which is connected to the common potential line. A third transistor is connected in parallel to the source terminal and drain terminal of the first transistor. A fourth transistor includes a gate terminal, which is connected to the first current source, and a source terminal, which is connected to the gate terminal of the output transistor. A second current source is arranged between the gate terminal of the output transistor and the common potential line. The third transistor includes a gate terminal supplied with voltage of the output terminal.

Other aspects and advantages of the present invention will become apparent from the following description, taken in conjunction with the accompanying drawings, illustrating by way of example the principles of the invention.

Figure 1:
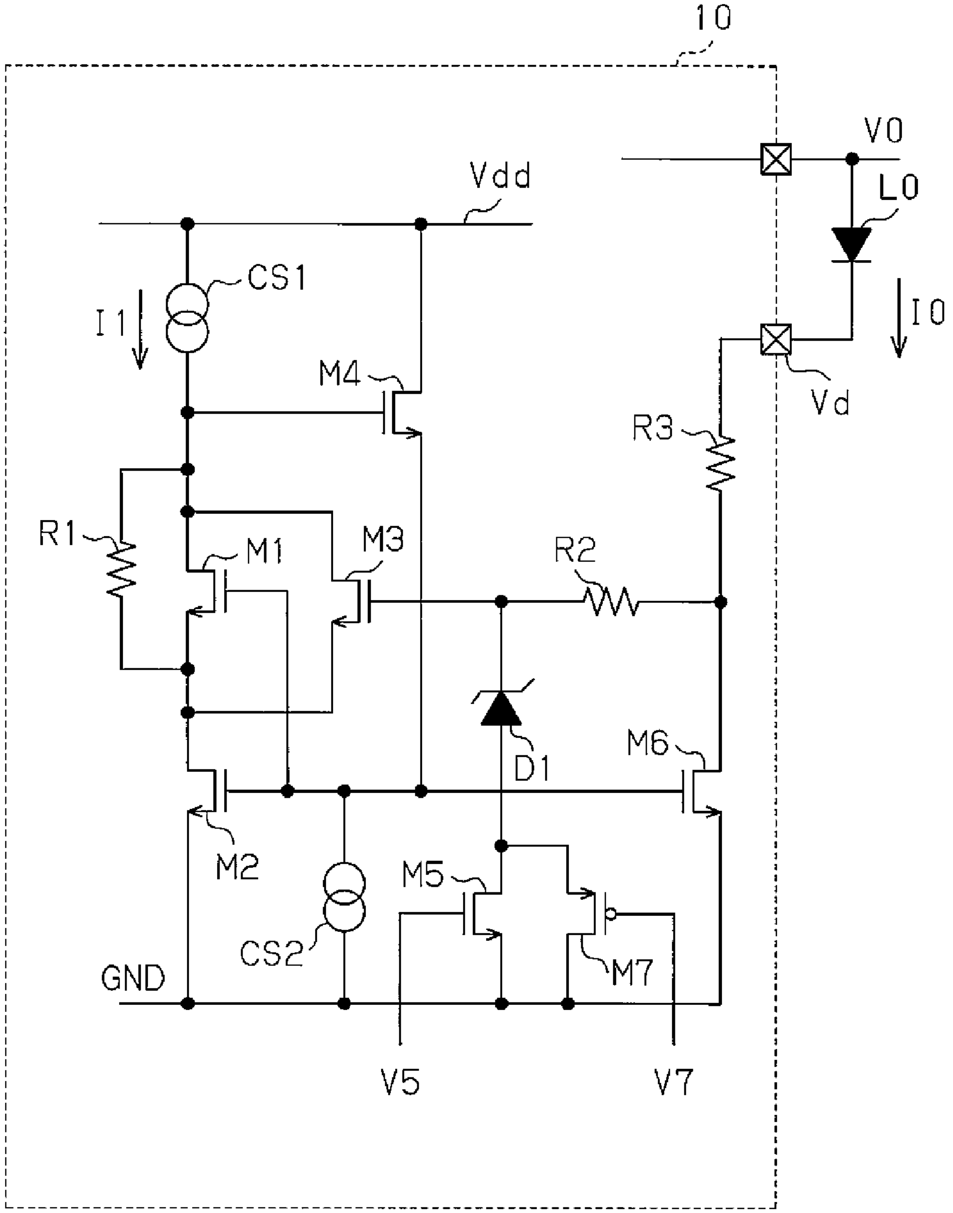
FIG. 1 is a schematic circuit diagram showing a current drive circuit according to one embodiment of the present invention.
Figure 2A:
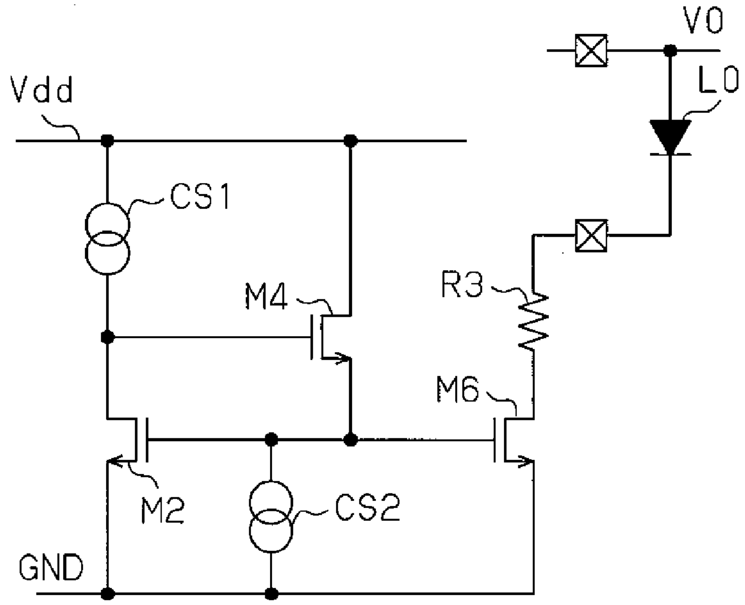
FIG. 2A is a schematic circuit diagram of an equivalent circuit of the current drive circuit of FIG. 1 when the drain voltage is high.
Figure 2B:
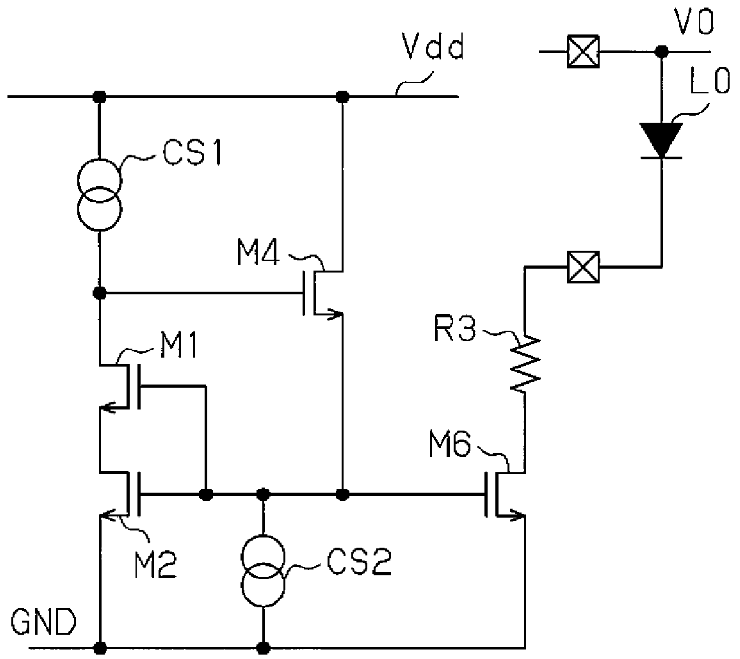
FIG. 2B is a schematic circuit diagram of an equivalent circuit of the current drive circuit of FIG. 1 when the drain voltage is low.
Figure 3:
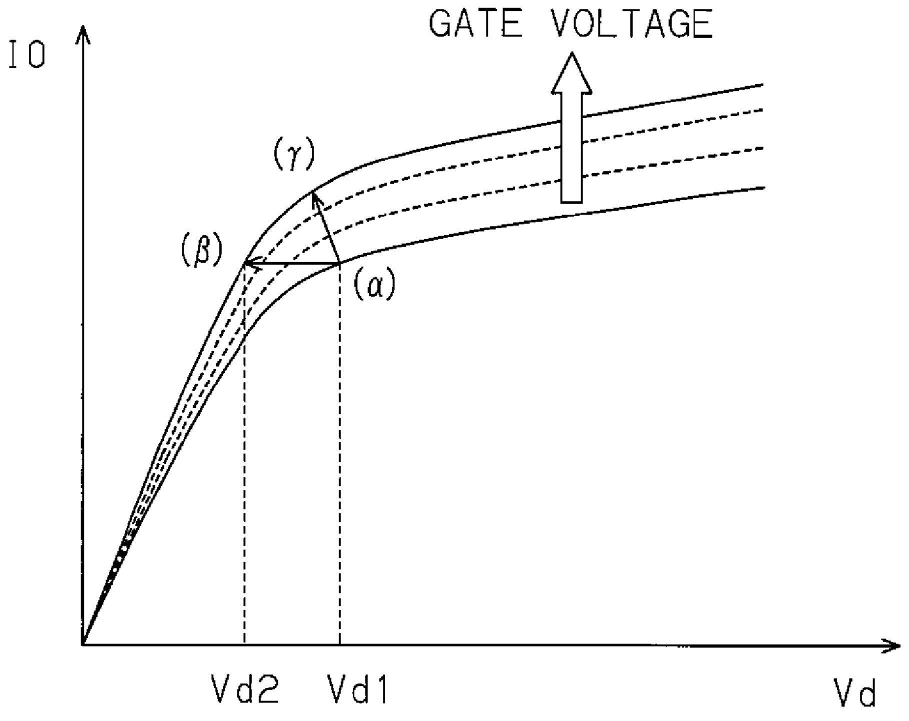
FIG. 3 is a graph showing the relationship between the drain voltage and the drain current.

A current drive circuit according to one embodiment of the present invention will now be discussed with reference to FIGS. 1 to 3. In the present invention, a current drive circuit 10 supplies current to an element L0 (in this case, an LED). The element L0 is connected to a power line for receiving a voltage V0. The current drive circuit 10, which is an open drain type current source, has an output terminal connected to the element L0. Voltage Vd is applied to the output terminal and current I0 is supplied to the output terminal.

[Circuit Structure]

The circuit structure of the current drive circuit 10 will now be described.

A resistor R3 is connected to the output terminal of the current drive circuit 10. The resistor R3 functions as an ESD resistor. The ESD resistor R3 is connected to a resistor R2 and the drain of a transistor M6. In the present embodiment, the transistor M6, which functions as an output transistor, is formed by an NMOS transistor. The source of the output transistor M6 is connected to a ground or common potential line.

The gate of the output transistor M6 is connected to the gate of a second transistor M2, a grounded current source CS2 (second current source), and the source of a fourth transistor M4. In this embodiment, the second and fourth transistors M2 and M4 are NMOS transistors.

The drain of the fourth transistor M4 is connected to a power supply line and supplied with a voltage Vdd.

A current source CS1, which generates a reference current I1, is connected to the power supply line (Vdd). The current source CS1 also is connected to the gate of the fourth transistor M4, the drain of a third transistor M3, the drain of a first transistor M1, and a resistor R1. In this embodiment, the first and third transistors M1 and M3 are NMOS transistors.

The gate of the first transistor M1 is connected to the gate of the second transistor M2. The source of the first transistor M1 and the source of the third transistor M3 are connected to the drain of the second transistor M2. The source of the second transistor M2 is connected to the ground line.

The resistor R1 is connected between the drain and the source of the first transistor M1, and thus is connected in parallel with the first transistor M1.

A node between the ESD resistor R3 and the drain of the output transistor M6 is connected via the resistor R2 to the gate of the third transistor M3. A node between the resistor R2 and the gate of the third transistor M3 is connected to the cathode of a rectifying element, in this embodiment a Zener diode D1. The anode of the diode D1 is connected to the drain of a fifth transistor M5 and the source of a seventh transistor M7. In the present embodiment, the fifth and seventh transistors M5 and M7 are PMOS transistors.

The source of the fifth transistor M5 and the drain of the seventh transistor M7 are connected to the ground line. The gate of the fifth transistor M5 is supplied with a voltage V5 from an external device, and the gate of the seventh transistor M7 is supplied with a voltage V7 also from an external device. The voltage V5 is supplied from a system (not shown) that monitors the voltage V0, which drives the element L0. As the voltage V0 gradually rises, the voltage V5 is provided, which activates the fifth transistor M5. Further, due to the internal regulator voltage of an IC, the voltage V7 goes to 0 V when the chip is not operating.

[Operation]

The operation of the current drive circuit 10 will now be discussed with additional reference to FIG. 3.

During normal operation, the voltage Vd is high and thus across the resistors R3 and R2 is high, and so the third transistor M3 is turned on. When the third transistor M3 is turned on, the first transistor M1 and the resistor R1 are bypassed. FIG. 2A is a schematic circuit diagram of an equivalent circuit for when voltage Vd is high and the third transistor M3 is on. In this case, current I1 flows through the transistor M2 and the voltage at the gate of the fourth transistor M4 increases, which allows the current supplied by the current source CS2 to add to the generation of the current I1. Also, the gate voltage of the output transistor M6 increases due to its connection to the source of the transistor M4.

When the voltage Vd decreases, the on resistance of the third transistor M3 increases and then the first transistor M1 and the resistor R1 appear in the circuit structure. FIG. 2B is a schematic circuit diagram of an equivalent circuit of the current drive 10 when the third transistor M3 is off. In this case, the current source CS1 supplies the current I1 to the first and second transistors M1 and M2. Thus, the voltage at the node between the current source CS1 and the drain of the first transistor M1 increases. In accordance with this increased voltage, the gate voltage of the fourth transistor M4 increases, and as a result, the gate voltage of the output transistor M6 increases. This decreases the on resistance of the output transistor M6 and supplies the element L0 with a large amount of current I0.

The ESD resistor R1 prevents the first transistor M1 from being suddenly activated. There may be variations in the threshold value of the first transistor M1. Referring to FIG. 3, in such a case, due to the threshold voltage of the first transistor M1, a change in the output voltage from voltage Vd1 to voltage Vd2 would cause a shift from state (α) to state (γ). This may result in the drain current being increased. In particular, the environmental temperature may change the threshold voltage that causes a shift to state (γ). Thus, the resistance value of the resistor R1 is set so that the output current value is constant. This ensures shifting from state (α) to state (β).

A protection circuit that functions when the drain voltage of the output transistor M6 becomes high will now be discussed. Two cases in which the voltage Vd increases will be described. Specifically, the voltage Vd may slowly increase during normal operation. In this case, the fifth transistor M5 will be turned on. When the voltage Vd suddenly increases such as when there is a surge voltage, the seventh transistor M7 is turned on.

In the current drive circuit 10 according to the present invention, the voltage Vd at the output terminal is supplied to the gate of the third transistor M3 via a resistor (R2). Thus, a protection circuit is used to prevent a break down of the gate of the third transistor M3. The protection circuit includes the resistor R2, the diode D1, and the transistors M5 and M7. The resistor R2 limits the current that flows through the diode D1. Further, the resistor R2 forms a CR time constant with the gate capacitance of the third transistor M3, which prevents a sudden increase in voltage.

When the power supply voltage monitoring system detects an abnormal increase in the voltage V0, the voltage V5 is supplied and the fifth transistor M5 is turned on. When the diode D1 is activated by a high voltage, the diode D1 is grounded via the fifth transistor M5.

When the voltage V0 is constant, the voltage V7 remains high. The voltage V7 may be provided by the output voltage of a series regulator or the like that operates on the voltage V0. When the series regulator is not operating, the voltage V7 is 0 V, and the seventh transistor M7 becomes conductive. When the diode D1 is activated due to a surge voltage or the like, the diode D1 is grounded via the seventh transistor M7.

The above-described current drive circuit 10 has the following advantages.

When the voltage Vd is high during normal operation, the voltage supplied via the resistors R3 and R2 is high. This activates the third transistor M3. When the voltage Vd decreases, the on resistance of the third transistor M3 increases. Thus, the transistors M1 and M2 are connected in series. This increases the voltage at the gate of the output transistor M6 so the output current is maintained.

The resistor R1 is connected in parallel with the first transistor M1. By setting the resistance value of the resistor R1 with the threshold voltage of the third transistor M3, an increase in the drain current is suppressed, and smooth voltage shifting is achieved.

The protection circuit prevents breakage at the gate of the third transistor M3. When the voltage V5 is supplied and the diode D1 is activated, the diode D1 is connected to ground via the fifth transistor M5. When the voltage V7 is 0 V and the diode D1 is activated due to a voltage surge or the like, the diode D1 is grounded via the seventh transistor M7. This prevents breakage at the gate of the seventh transistor M3.

It should be apparent to those skilled in the art that the present invention may be embodied in many other specific forms without departing from the spirit or scope of the invention. Particularly, it should be understood that the present invention may be embodied in the following forms.

In the above-described embodiment, the current drive circuit 10 supplies current to the element L0, which may be an LED. However, the subject of the element L0 is not limited in such a manner.

In the above-described embodiment, the resistor R1 is connected in parallel with the first transistor M1. However, the resistor R1 may be eliminated if the threshold voltage of the third transistor M3 is controlled for shifting from state (α) to state (β) (FIG. 3).

The transistors M1, M3, M4, and M6 are N-type MOS transistors. In an open drain type current drive circuit, to change the gate voltage of the transistor M6, other types of transistors may be used as long as the circuit uses the transistor M3 that supplies the gate terminal with the output terminal voltage.

The present examples and embodiments are to be considered as illustrative and not restrictive, and the invention is not to be limited to the details given herein, but may be modified within the scope and equivalence of the appended claims.

What is claimed is:

1. A current drive circuit, comprising:
- an output terminal connected to a load, which is connected to a power supply voltage;
- an output transistor including a drain connected to the output terminal and a source connected to a common potential line;
- a first transistor including a gate connected to a gate of the output transistor, and a drain connected to a first current source, wherein the first current source supplies a reference current;
- a second transistor including a gate connected to the gate of the output transistor, a drain connected to a source of the first transistor, and a source connected to the common potential line;
- a third transistor connected between the source and drain of the first transistor;
- a fourth transistor including a gate connected to the first current source, and a source connected to the gate of the output transistor; and
- a second current source connected between the gate of the output transistor and the common potential line;
- wherein a gate of the third transistor is supplied with voltage of the output terminal.

2. The current drive circuit of claim 1, further comprising:
- an ESD resistor arranged between the output terminal and the output transistor.

3. The current drive circuit of claim 1, further comprising:
- a first resistor connected between the source and drain of the first transistor.

4. The current drive circuit of claim 3, further comprising:
- a second resistor connected between an ESD resistor and the gate of the third transistor.

5. The current drive circuit of claim 1, further comprising:
- a rectifying element connected between the third transistor and the output terminal; and
- a circuit connected to the rectifying element that is activated when the power supply voltage has an abnormal value.

6. The current drive circuit of claim 5, further comprising a fifth transistor connected to the rectifying element and activated when the power supply voltage is less than a predetermined value.

7. The current drive circuit of claim 6, further comprising a seventh transistor connected to the rectifying element and activated when the power supply voltage is greater than a predetermined value.

8. The current drive circuit of claim 7, wherein the rectifying element comprises a Zener diode.

9. A current drive circuit, comprising:
- an output terminal connected to a load;
- an output transistor having a drain connected to the output terminal and a source connected to a common potential line;
- a first transistor having a gate connected to a gate of the output transistor;
- a first current source connected between the power supply line and a drain of the first transistor, wherein the first current source generates a reference current (I1);
- a second transistor having a gate connected to the gate of the output transistor, a drain connected to a source of the first transistor, and a source connected to the common potential line;
- a third transistor having a drain connected to the drain of the first transistor and a source connected to the source of the first transistor;
- a fourth transistor having a gate connected to the first current source, a source connected to the gate of the output transistor, and a drain connected to the power supply line;
- a second current source connected between the gate of the output transistor and the common potential line; and
- an ESD resistor connected between the load, and the drain of the output transistor and a gate of the third transistor.

10. The current drive circuit of claim 9, further comprising a first resistor connected in parallel with the first transistor.

11. The current drive circuit of claim 10, further comprising a protection circuit connected between the ESD transistor the gate of the third transistor for preventing a break down at the gate of the third transistor.

12. The current drive circuit of claim 11, wherein the protection circuit includes a second resistor connected between the ESD transistor and the gate of the third transistor, and a rectifying element connected between the gate of the third transistor and the common potential line.

13. The current drive circuit of claim 12, wherein the rectifying element comprises a Zener diode.

14. The current drive circuit of claim 12, wherein the protection circuit further comprises:
- a fifth transistor having a drain connected to the rectifying element and a source connected to the common potential line; and
- a seventh transistor having a source connected to the rectifying element and a drain connected to the common potential line, wherein gates of the fifth and seventh transistors are connected to a monitor circuit such that the fifth transistor is turned on when a load voltage gradually increases beyond a predetermined value and the seventh transistor is turned on when there is a voltage surge of the load voltage.

* * * * *